United States Patent
Kim et al.

(10) Patent No.: US 9,583,684 B2
(45) Date of Patent: Feb. 28, 2017

(54) EDGE COUPLING ALIGNMENT USING EMBEDDED FEATURES

(71) Applicant: Intel Corporation, Santa Clara, CA (US)

(72) Inventors: Brian H. Kim, Fremont, CA (US); Simon Lee, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/957,720

(22) Filed: Dec. 3, 2015

(65) Prior Publication Data

US 2016/0087172 A1  Mar. 24, 2016

Related U.S. Application Data

(62) Division of application No. 13/721,928, filed on Dec. 20, 2012, now Pat. No. 9,209,369.

(51) Int. Cl.
*G06F 17/50* (2006.01)
*H01L 33/58* (2010.01)
(Continued)

(52) U.S. Cl.
CPC ............ *H01L 33/58* (2013.01); *H01L 23/544* (2013.01); *H01L 24/81* (2013.01); *H01L 24/83* (2013.01); *H01L 24/13* (2013.01); *H01L 24/16* (2013.01); *H01L 24/32* (2013.01); *H01L 2223/5448* (2013.01); *H01L 2223/54426* (2013.01); *H01L 2223/54486* (2013.01); *H01L 2224/131* (2013.01); *H01L 2224/16225* (2013.01); *H01L 2224/32225* (2013.01); *H01L 2224/81139* (2013.01); *H01L 2224/81141* (2013.01);
(Continued)

(58) Field of Classification Search
CPC ....... H01L 33/00; H01L 33/58; H01L 23/498; G06F 17/5068
See application file for complete search history.

(56) References Cited

U.S. PATENT DOCUMENTS

2008/0303143 A1* 12/2008 Choi .................. H01L 24/11
257/737
2010/0217102 A1* 8/2010 LeBoeuf ............ A61B 5/00
600/310

(Continued)

OTHER PUBLICATIONS

Office Action received for U.S. Appl. No. 13/721,928, mailed on Apr. 20, 2015, 16 pages.
(Continued)

*Primary Examiner* — Thomas L Dickey
(74) *Attorney, Agent, or Firm* — Jordan IP Law, LLC

(57) ABSTRACT

Methods and systems may provide an alignment scheme for components that may reduce positional deviation between the components. The method may include placing a first component on top of a substrate, wherein the first component includes a receiving alignment feature, and coupling a second component to the first component, wherein the coupling includes inserting a protruding alignment feature of the second component into the receiving alignment feature of the first component. In one example, the first component includes an edge-emitting semiconductor die and the second component include one or more of an optical lens and an alignment frame.

6 Claims, 3 Drawing Sheets

(51) Int. Cl.
*H01L 23/544* (2006.01)
*H01L 23/00* (2006.01)

(52) U.S. Cl.
CPC .............. *H01L 2224/8314* (2013.01); *H01L 2224/83139* (2013.01); *H01L 2224/83141* (2013.01); *H01L 2924/12041* (2013.01); *H01L 2924/14* (2013.01); *H01L 2933/0058* (2013.01)

(56) References Cited

U.S. PATENT DOCUMENTS

2012/0049350 A1* 3/2012 Grillberger ......... H01L 21/4853
257/737
2012/0229141 A1* 9/2012 Brown ................. G01R 33/422
324/322

OTHER PUBLICATIONS

Notice of Allowance received for U.S. Appl. No. 13/721,928, mailed on Jul. 15, 2015, 7 pages.

\* cited by examiner

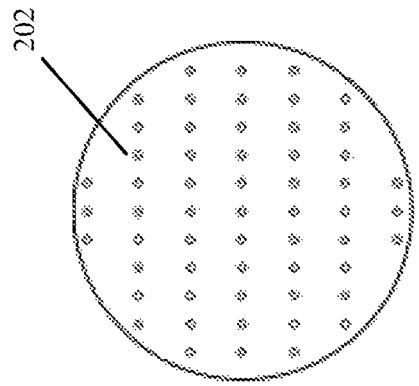
FIG. 3A
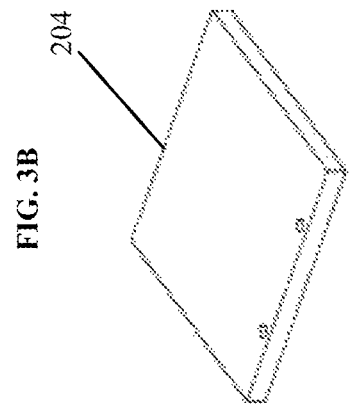
FIG. 3B
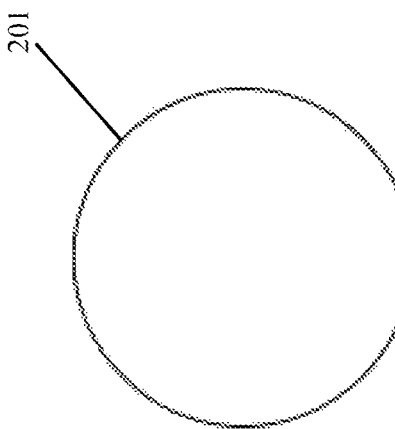
FIG. 3C
FIG. 3D
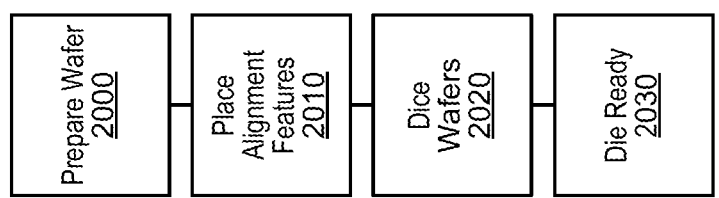
FIG. 2

EDGE COUPLING ALIGNMENT USING EMBEDDED FEATURES

CROSS-REFERENCE TO RELATED APPLICATIONS

The present application is a divisional of U.S. patent application Ser. No. 13/721,928, filed on Dec. 20, 2012, now U.S. Pat. No. 9,209,369.

BACKGROUND

An increasing demand of consumer electronics devices may have also generated an increasing demand for smaller and faster packaging solutions. For example, an optical package in a mobile device may include a edge-emitting semiconductor device and a mechanical part, wherein packaging may require placement and alignment of these two components.

In one example, marks on an alignment frame may be used to align and place the semiconductor and the mechanical part on a substrate. In another example, visual alignment equipment maybe used. In still another example, the semiconductor device and the mechanical part may be manually aligned. However, each of these techniques may increase risk of positional deviation between the assembled components.

BRIEF DESCRIPTION OF THE DRAWINGS

The various advantages of the embodiments of the present invention will become apparent to one skilled in the art by reading the following specification and appended claims, and by referencing the following drawings, in which:

FIG. 2 is a flowchart of an example of a method of preparing a die according to an embodiment;

FIGS. 3A-3D are illustrations of an example of a die preparation process according to an embodiment;

FIGS. 5A-5C are illustrations of an example of a component alignment process according to an embodiment.

DETAILED DESCRIPTION

Embodiments may provide an alignment scheme to reduce positional deviation for components during assembly of structures including edge-emitting semiconductor devices. Consequently, the components may be assembled more compactly, and may contribute to smaller and more efficient packaging solutions. In embodiments of the present invention, as will be discussed in greater detail, physical features of the components may be used for alignment purposes.

In a first example, a first component for assembly may be a mechanical part (e.g., an optical lens or an alignment frame), while a second component for assembly may be an edge-emitting semiconductor device. As will be discussed in greater detail, alignment features (e.g., holes, recesses, fasteners, etc.) of various shapes, sizes, and physical characteristics (e.g., circular, squared, or diamond shaped) may be embedded on the semiconductor device via various assembly and fabrication techniques (e.g., an etching process). These features can be used to capture the corresponding alignment features on the mechanical part.

Figure 1:
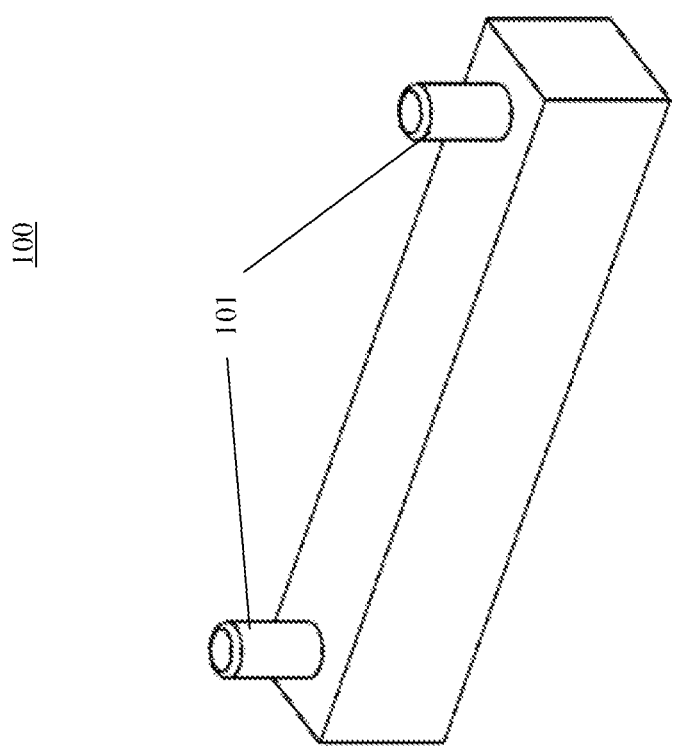
FIG. 1 is a block diagram of an example of a mechanical part according to an embodiment.
Figure 4:
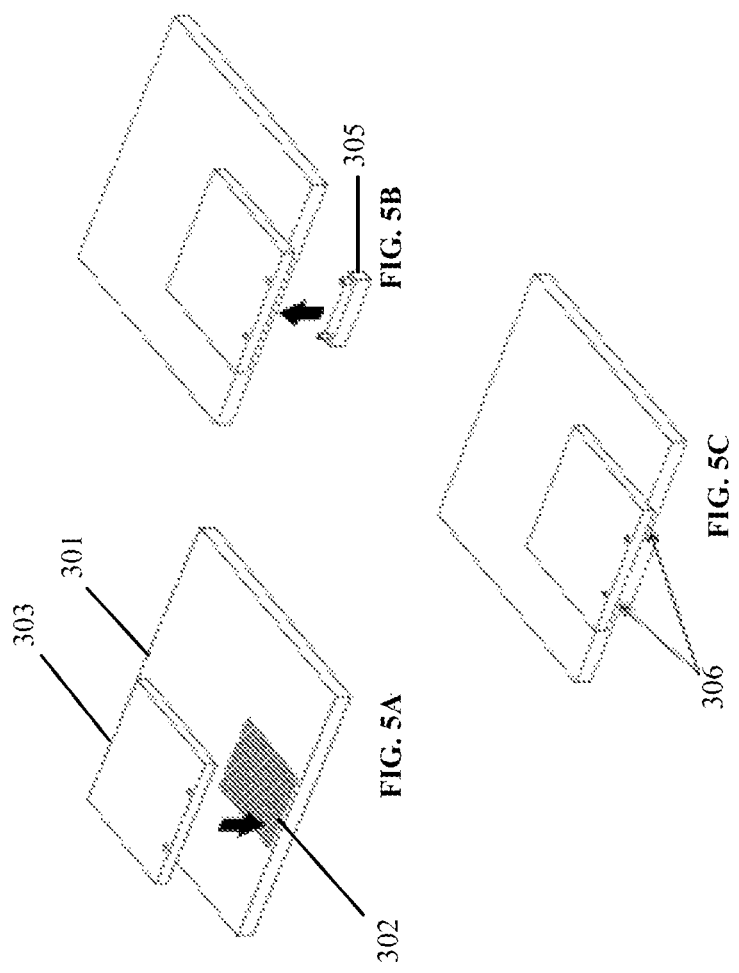
FIG. 4 is a flowchart of an example of a method of aligning components according to an embodiment.
Figure 4:
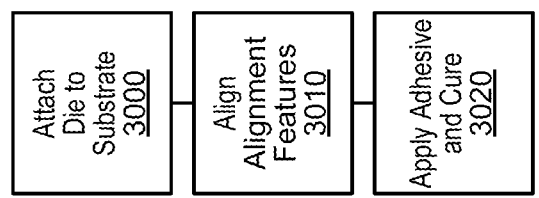

Turning now to FIG. 1, a block diagram of an example of a mechanical part 100 is shown. The mechanical part 100 may include one or more alignment features 101. In this example, the alignment features 101 may be a first fastener located on a first end of the mechanical part 100, and a second fastener located on a second end of the mechanical part 100. Also, in this example, the first fastener and the second fastener may be in the shape of circular columns extending away from the body of the mechanical part 100. These alignment features 101 may be sized to correspond to embedded alignment features on another device, such as an edge-emitting semiconductor device.

Turning now to FIGS. 2 and 3A-3D, a flowchart and an illustration of an example of a fabrication process of a component configured to support an alignment scheme according to an embodiment are shown. In this example, the component may be a edge-emitting semiconductor.

The method might be implemented as a set of logic instructions stored in a machine- or computer-readable storage medium such as, for example, random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as application specific integrated circuit (ASIC), complementary metal oxide semiconductor (CMOS) or transistor-transistor logic (TTL) technology, in semiconductor fabrication equipment, or any combination thereof.

At processing block 2000, a semiconductor wafer sheet, such as wafer sheet 201 (FIG. 3A), may be prepared for fabrication.

At processing block 2010, one or more embedded features, such as alignment apertures 202 (FIG. 3B), may be fabricated onto a surface of the semiconductor wafer sheet. The alignment apertures may be sized to correspond to embedded alignment features on another device, such as the fasteners on the mechanical part 100 (FIG. 1).

The embedded features may be fabricated on the semiconductor wafer sheet utilizing one or more methods. For example, micro-fabrication techniques such as deep reactive-ion etching (DRIE), wet chemical etching, and ultrasonic machining may be used. In addition, the semiconductor wafer sheet may also be fabricated to include bonding features for placement on a substrate.

At processing block 2020, the semiconductor wafer sheet may be diced, such as along dicing lines 203 (FIG. 3C), to generate individual semiconductor dies. At processing block 2030, an individual semiconductor die 204 (FIG. 3D) may be prepared for assembly.

Turning now to FIGS. 4 and 5A-5C, a flowchart and an illustration of an example of component alignment according to an embodiment according to an embodiment is shown. In this example, a semiconductor die, similar to the semiconductor die 204 (FIG. 3D), may be attached to a substrate, and further may be aligned and attached to a mechanical part, similar to the mechanical part 101 (FIG. 1).

In this example, the mechanical part may be an optical lens. The optical lens and the semiconductor die may be configured to vertically couple an optical signal. So, if the semiconductor may emit an optical signal from a surface of an overhanging portion, a fastener, similar to the alignment feature 101 (FIG. 1), may allow the transfer of the optical signal between the semiconductor die and the optical lens. In this example, the circular column shape the fastener may facilitate the vertical coupling.

The method might be implemented as a set of logic instructions stored in a machine- or computer-readable storage medium such as, for example, RAM, ROM, PROM, firmware, flash memory, etc., in configurable logic such as, for example, PLAs, FPGAs, CPLDs, in fixed-functionality logic hardware using circuit technology such as ASIC, CMOS or TTL technology, in semiconductor manufacturing equipment, or any combination thereof.

At processing block 3000, a semiconductor die may be placed on the substrate. For example, as shown in FIG. 5A, a semiconductor die 303 may be placed at a placement location 302 on a substrate 301. The substrate 301 may be suitable for various bonding schemes. For example, bonding schemes such as ball grid array packaging, flip-chip process, and epoxy die placement may be used. Moreover, the placement location 302 may be fabricated to include bonding features (e.g., solder bumps) to facilitate the bonding of the semiconductor die 303 and the substrate 301.

In this example, the semiconductor die 303 may be placed overhanging the substrate 301, and may include alignment features configured to facilitate component alignment. In this example, the semiconductor die 303 may include alignment apertures similar to the alignment apertures 202 (FIG. 3B).

At processing block 3010, the mechanical part may be installed on the semiconductor device. So, in this example, a mechanical part 305, as shown in FIGS. 5B and 5C, may be installed on the semiconductor die 303. The mechanical part 305 may include a fastener, such as the alignment feature 101 (FIG. 1), which may be used to align with and attach to the alignment apertures 304 of the semiconductor die 303.

At processing block 3020, upon securing the mechanical part 305 to the semiconductor die 303, an adhesive may be applied at one or more application points 306 to fasten the mechanical part 305 to the semiconductor die 303. The adhesive may then be cured to complete assembly.

Embodiments may therefore provide for a system comprising a wireless radio component, a memory component coupled to the wireless radio component, and a processing component coupled to the memory component. The system may also include a semiconductor die to conduct data input/output (I/O) coupled to the processing component including a receiving alignment feature, and a mechanical part including a protruding alignment feature, wherein the semiconductor die overhangs a substrate to allow the protruding alignment feature of the mechanical part to be aligned with and to be inserted into the receiving alignment feature of the semiconductor die.

In one example, the receiving alignment feature is one or more surfaces defining an aperture sized to fit the protruding alignment feature of the mechanical part.

In another example, the protruding alignment feature is a fastener sized to fit the receiving alignment feature of the semiconductor die.

In one more example, the semiconductor die is to be attached to the mechanical part by applying an adhesive to one or more application points.

In still another example, the semiconductor die and the mechanical part is configured to operate in one of a smart phone, a notebook, and a tablet device.

In one example, the substrate is to include a bonding feature to facilitate bonding of the semiconductor die and the substrate.

In another example, the bonding feature is a solder bump.

Still another embodiment may provide for a method comprising placing a first component on top of a substrate, wherein the first component includes a semiconductor die and a receiving alignment feature, and coupling a second component to the first component, wherein the coupling includes inserting a protruding alignment feature of the second component into the receiving alignment feature of the first component.

In one example, the semiconductor die is an edge-emitting semiconductor die.

In another example, the receiving alignment feature is one or more surfaces defining an aperture sized to fit the protruding alignment feature of the second component.

In still another example, the second component is a mechanical part including one or more of an optical lens and an alignment frame.

In yet another example, the protruding alignment feature is a fastener sized to fit the receiving alignment feature of the first component.

In one example, the method further includes attaching the first component and the second component utilizing a bonding method.

In another example, a portion of the first component overhangs the substrate.

In still another example, the method further includes bonding the first component and the substrate utilizing a bonding feature on the substrate.

In another example, the bonding feature is a solder bump.

Yet another embodiment may provide for an apparatus comprising a first component including a semiconductor die and a receiving alignment feature, and a second component including a protruding alignment feature.

In one example, the first component overhangs a substrate to allow the protruding alignment feature of the second component to be aligned with and to be inserted into the receiving alignment feature of the first component.

In another example, the receiving alignment feature is one or more surfaces defining an aperture sized to fit the protruding alignment feature of the second component.

In still another example, the protruding alignment feature is a fastener sized to fit the receiving alignment feature of the first component.

In yet another example, the first component is attached to the second component by application of an adhesive to one or more application points.

In another example, the semiconductor die is an edge emitting semiconductor die.

In one example, the second component is a mechanical part including one or more of an optical lens and an alignment frame.

In one more example, the semiconductor die and the optical lens are to vertically couple an optical signal there between.

One more example may provide for at least one computer readable storage medium comprising a set of instructions. The set of instructions, if executed by a processor, cause a computer to place a first component on top of a substrate, wherein the first component includes a semiconductor die and a receiving alignment feature, and couple a second component to the first component, wherein a protruding alignment feature of the second component is to be inserted into the receiving alignment feature of the first component.

In one example, if executed, the set of instructions cause a computer to attach the first component and the second component utilizing a bonding method.

In another example, the semiconductor die is to be an edge-emitting semiconductor die.

In still another example, the receiving alignment feature is an aperture sized to fit the protruding alignment feature of the second component.

In one more example, the second component is to be a mechanical part including one or more of an optical lens and an alignment frame.

In one example, the protruding alignment feature is a fastener sized to fit the receiving alignment feature of the first component.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

Some embodiments may be implemented, for example, using a machine or tangible computer-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. At least one computer readable storage medium comprising a set of instructions which, if executed by a processor, cause a machine to:

place a first component on top of a substrate to provide a portion of the first component overhanging the substrate to extend laterally beyond an edge of the substrate, wherein the first component includes a semiconductor die and a receiving alignment feature; and couple a second component to the first component, wherein a protruding alignment feature of the second component is to be inserted into the receiving alignment feature of the first component.

2. The at least one computer readable storage medium of claim 1, wherein, if executed, the set of instructions cause a machine to attach the first component and the second component utilizing a bonding method.

3. The at least one computer readable storage medium of claim 1, wherein the semiconductor die is to be an edge-emitting semiconductor die.

4. The at least one computer readable storage medium of claim 1, wherein the receiving alignment feature is an aperture sized to fit the protruding alignment feature of the second component.

5. The at least one computer readable storage medium of claim 1, wherein the second component is a mechanical part including one or more of an optical lens or an alignment frame.

6. The at least one computer readable storage medium of claim 1, wherein the protruding alignment feature is a fastener sized to fit the receiving alignment feature of the first component.

* * * * *